United States Patent
Suzuki et al.

(10) Patent No.: US 7,906,044 B2
(45) Date of Patent: Mar. 15, 2011

(54) THERMOELECTRIC MATERIAL

(75) Inventors: Satoshi Suzuki, Osaka (JP); Takahiro Fujiki, Osaka (JP)

(73) Assignee: Yanmar Co., Ltd, Osaka (JP)

( * ) Notice: Subject to any disclaimer, the term of this patent is extended or adjusted under 35 U.S.C. 154(b) by 281 days.

(21) Appl. No.: 12/280,308

(22) PCT Filed: Jan. 15, 2007

(86) PCT No.: PCT/JP2007/050427
§ 371 (c)(1),
(2), (4) Date: Oct. 3, 2008

(87) PCT Pub. No.: WO2007/097136
PCT Pub. Date: Aug. 30, 2007

(65) Prior Publication Data
US 2010/0230645 A1    Sep. 16, 2010

(30) Foreign Application Priority Data
Feb. 24, 2006 (JP) .................. 2006-048462

(51) Int. Cl.
*H01B 1/02* (2006.01)
*H01B 1/04* (2006.01)

(52) U.S. Cl. .................. 252/512; 252/516; 136/240

(58) Field of Classification Search .................. 252/512, 252/516, 518.1; 420/127, 103, 78; 136/240
See application file for complete search history.

(56) References Cited

U.S. PATENT DOCUMENTS
4,013,425 A *   3/1977  Muhlberger et al. .......... 428/619
2008/0236644 A1* 10/2008 Sakurada et al. ............. 136/239

FOREIGN PATENT DOCUMENTS
| EP | 1 289 026 A2 | 3/2003 |
|---|---|---|
| JP | 2003-197985 | 7/2003 |
| JP | 2004-119648 | 4/2004 |
| JP | 2004-253618 | 9/2004 |
| JP | 2005-277343 | 10/2005 |
| JP | 2006-019402 | 1/2006 |
| WO | WO 03/019681 | 3/2003 |

OTHER PUBLICATIONS
English lang. translation of JP 2004 119648 (Apr. 2004).*
English lang. translation of JP 2005 277343 (Oct. 2005).*
International Search Report mailed on Apr. 17, 2007 for International Application No. PCT/JP2007/050427 filed on Jan. 15, 2007.

(Continued)

*Primary Examiner* — Mark Kopec
(74) *Attorney, Agent, or Firm* — Sterne, Kessler, Goldstein & Fox P.L.L.C.

(57) ABSTRACT

A thermoelectric material, which has a superior thermoelectric characteristic and is environment-friendly and is suitable for mass productivity due to the lower cost, is provided. The thermoelectric material is an iron alloy that mainly contains Fe, V and Al and that carbides are dispersed into the matrix, wherein [V concentration−C concentration] is 20 or more at % to 32 or less at % and [Al concentration+Si concentration] is 20 or more at % to 30 or less at %. Especially in the thermoelectric material of the present invention, a high Seebeck coefficient can be kept and a lower electrical resistivity can be obtained, thereby improving an output factor and achieving a superior thermoelectric characteristic.

9 Claims, 4 Drawing Sheets

OTHER PUBLICATIONS

"Seebeck coefficient of (Fe,V)$_3$Al alloys," Hanada et al., Journal of Alloys and Compounds, 329 (2001), pp. 63-68.

Patent Abstracts of Japan, abstract of Publication No. JP 2004-119648, p-Type Thermoelectric Conversion Material and Thermoelectric Conversion Element Using It, published Apr. 15, 2004, (listed on accompanying PTO/SB/08A as document FP1).

Patent Abstracts of Japan, abstract of Publication No. JP 2004-253618, Thermoelectric Conversion Material, published Sep. 9, 2004, (listed on accompanying PTO/SB/08A as document FP2).

Patent Abstracts of Japan, abstract of Publication No. JP 2003-197985, Thermoelectric Conversion Material and Thermoelectric Conversion Element Using The Same, published Jul. 11, 2003, (listed on accompanying PTO/SB/08A as document FP3).

Supplementary European Search Report and European Search Opinion for European Application No. 07706761.9 mailed on Dec. 9, 2009, 10 pgs.

* cited by examiner

THERMOELECTRIC MATERIAL

BACKGROUND OF THE INVENTION

1. Field of the Invention

The present invention relates to a thermoelectric material.

2. Related Art

In recent years, thermoelectric generation as a new energy conversion technology having low environmental impact has been recognized. A Seebeck effect, which converts heat energy into electrical energy by a temperature difference between materials using a p-type thermoelectric material and a n-type thermoelectric material, is used in such technology.

A thermoelectric conversion efficiency performance index Z is represented by the following Equation 1 using Seebeck coefficient S, electric resistance ρ, and thermal conductivity κ as characteristics of the materials.

$$Z = S^2/\rho\kappa \quad \text{Equation 1:}$$

Wherein $S^2/\rho$ is referred to as an output factor, which is an indicator of a thermoelectric characteristic showing the extent of an electric current. Accordingly, material having a high Seebeck coefficient and a low electrical resistivity and thermal conductivity is preferable so as to enhance the thermoelectric conversion efficiency.

Semiconductor sintered materials such as Bi—Te system, Pb—Te system and Si—Ge system account for much of the conventional thermoelectric materials. Recently, Co—Sb skutterudite system and layered oxide or the like have been studied. A thermoelectric cooling technology that uses Bi—Te system and applies a Peltier effect has already been put to practical use in an electric refrigerator and a temperature-control device. A generating technology using the Seebeck effect has been put to practical use only in specialized applications such as a satellite power supply, due to the issues of cost posed by growing in size or the like.

B (boron) and Se (selenium) must be added to the conventional thermoelectric semiconductor because p-type and n-type thermoelectric materials are used in a Bi—Te system. Se, Te (tellurium) and Pb (lead) are detrimental elements and they are unfavorable in terms of the global environment. Materials are expensive as the above elements and Ge (germanium) or the like are scarce.

In the Fe—V—Al system of the present invention, it is well known that the code of the Seebeck coefficient significantly changes by slightly scooting down the Fermi level due to a slight change in temperature of V (vanadium) in Fe2VAl (Journal of Alloys and Compounds, 329 (2001), p63-68). Because the Fe—V—Al system is an iron-containing material unlike the conventional semiconducting material, the thermoelectric material can be produced by adjusting ratios of atomic concentration to objective compositions and by casting it.

In the Fe—V—Al system of the present invention, when a part of Fe in Fe3Al having DO3-type crystal construction is replaced with V (vanadium), Fe3Al is changed to a more regular Heusler-type L21 crystal construction (Fe2VAl), thereby forming a sharp pseudogap to the Fermi level. In the Fe—V—Al system suggested hitherto, the thermoelectric characteristic is improved by replacing a part of Fe in Fe2VAl with Mn or Cr (see P2003-197985), by replacing a part of V in Fe2VAl with Ti or Mo (see JP2004-253618) and by replacing a part of Al in Fe2VAl with Si, Ge or Sn (see JP2004-253618).

BRIEF SUMMARY OF THE INVENTION

However, in the above well-known materials, the thermal conductivity is reduced by replacing them with the above alloy elements and by adding post-processes such as sinter or the like. The addition of the alloy elements should be left out as much as possible so as to reduce the costs of materials. The materials should be material compositions simple to manufacture and the manufacturing process should be simple.

Even if the Fe—V—Al system is a simple material composition by the addition of C (carbon), Si (silicon) and S (sulfur) like cast steels, the high Seebeck coefficient can be kept and the electrical resistivity can be considerably reduced, but the Seebeck coefficient should be further improved so as to enhance the conversion efficiency because the thermal conductivity shows little change.

Consequently, in view of these facts, an object of the present invention is to provide a thermoelectric material that has a superior thermoelectric characteristic, is environment-friendly and is suitable for mass production.

As a result of keen examinations by the inventors of the present invention to achieve that object, we found that the thermoelectric characteristic of the thermoelectric material can be improved by adequately adjusting a compounding ratio of the iron alloy thermoelectric material.

More specifically, the iron alloy thermoelectric material according to the present invention is characterized in that it mainly contains Fe, V and Al and that carbides are dispersed into the matrix and that [V concentration−C concentration] is 20 or more at % to 32 or less at % and [Al concentration+Si concentration] is 20 or more at % to 30 or less at %. Incidentally, [V concentration−C concentration] is a difference between V concentration and C concentration, and [Al concentration+Si concentration] is a sum of Al concentration and Si concentration.

The iron alloy thermoelectric material is a p-type iron alloy thermoelectric material in the case that [V concentration−C concentration] is 20 or more at % to less than 25 at % and [Al concentration+Si concentration] is 25 or more at % to 30 or less at %.

The iron alloy thermoelectric material is an n-type iron alloy thermoelectric material in the case that [V concentration−C concentration] is 25 or more at % to 32 or less at % and [Al concentration+Si concentration] is 20 or more at % to less than 25 at %.

The iron alloy thermoelectric material is characterized in that C concentration is above 0 at % to less than 10 at % and the Si concentration is above 0 at % to less than 5 at %.

The iron alloy thermoelectric material is characterized in that S concentration is above 0 at % to 0.5 or less at %.

The iron alloy thermoelectric material of the present invention has a fabulous thermoelectric characteristic without harmful and scarce elements, thereby reducing the cost of materials. The material can also be produced by the production process of only as-cast, thereby simplifying the process and improving productivity.

DETAILED DESCRIPTION OF THE INVENTION

Figure 1:
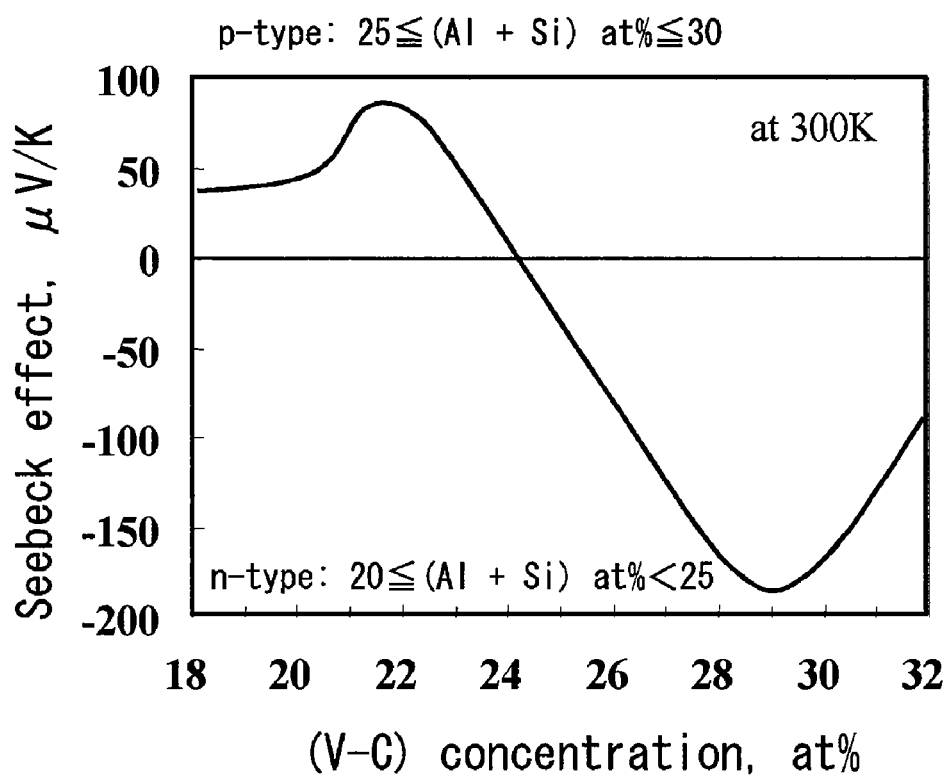
FIG. 1 is a diagram showing a relationship between a (V—C) concentration and the Seebeck coefficient.

A thermoelectric material according to the present invention will be described. First, a method for manufacturing the thermoelectric material will be described.

[Method for Manufacturing]

In the present embodiment, a pure iron, FeV (ferreous vanadium) and a pure aluminum (aluminum) are used as raw materials, which are dissolved under an argon gas atmosphere using a high frequency wave induction heating furnace. They are cast into a mold at a dissolution temperature of 1600 to 1800 degrees, thereby producing the thermoelectric material by fabricating an as-cast material.

Further, in the present invention, because the material system containing a large amount of V and Al has a high dissolution temperature, the thermoelectric material can be produced by adding elements such as C (carbon), Si (silicon) and S (sulfur) contained in the cast iron material, which have a favorable casting performance, so as to provide good casting performance. In the present invention, both of the high Seebeck coefficient and low electrical resistivity can be achieved by narrowing down the range of a constituent concentration using only these elemental additions.

Incidentally, the casting procedure is not limited by the above-mentioned procedure, and another procedure such as a vacuum casting may be used.

[Measuring Procedure]

The Seebeck coefficient was measured by fabricating a test specimen with ZEM-1S (ULVAC-RIKO, Inc). The electric resistance was measured by the direct current four-terminal method. The thermal conductivity was measured by the laser flash method.

[Methods of Analysis]

Infra-red radiation, emission spectrophotometry, ICP (inductively-coupled plasma spectrometry), EDX (energy dispersive X-ray analysis) and XRD (X-ray diffraction method) can be used so as to analyze the elements and carbide contents and so as to identify the compound.

An effect of the respective element additions on a Fe—V—Al system will be described.

The inventors produced various compositions for the respective elements of the Fe—V—Al system and the respective elements of C, Si and S so as to add to the Fe—V-A system, and evaluated the thermoelectric characteristic.

As a result, in the thermoelectric materials according to the present embodiment, V system carbides (V6C5, V8C7) were separated out by an addition of the carbon, and V concentration in the population was decreased, thereby influencing the thermoelectric performance (Seebeck coefficient). Therefore, the inventors found that the difference between V and C concentrations, i.e., [V concentration−C concentration] contributes significantly to the thermoelectric performance. It is experimentally obtained that the thermoelectric performance was largely changed by [Al concentration+Si concentration].

More specifically, when [V concentration−C concentration] is less than 20 at % and more than 32 at %, the Seebeck coefficient is extremely decreased. When [Al concentration+Si concentration] are less than 20 at % and more than 30 at %, the Seebeck coefficient is extremely decreased.

Therefore, in the thermoelectric materials according to the present embodiment, it is preferable that [V concentration−C concentration] is regulated so that it is 20 or more at % and 32 or less at % and [Al concentration+Si concentration] is 20 or more at % and 30 or less at %.

In the above compounding ratio, the carbide formation by adding the carbon shows a significant effect on the improvement of the thermoelectric characteristic, specifically, on the reduction of the electrical resistivity as a significant factor of the performance index, in comparison with the compound without the carbon.

Accordingly, in the iron alloy thermoelectric materials of the present invention, which mainly contain Fe, V and Al and which carbides are dispersed into the matrix, they have 20 or more at % and 32 or less at % of [V concentration−C concentration] as well as 20 or more at % and 30 or less at % of [Al concentration+Si concentration].

The addition of the carbon shows effects on the improvement of the casting performance due to the decrease in the dissolution temperature (melting point) and the reduction of the electrical resistivity. The additive amount of the carbon depends on the required dissolution temperature. The melting point is decreased by the minor addition of the carbon, but more than approximately 2 at % of the addition of the carbon is preferable so as to achieve a sufficient effect. Since an excess addition results in producing coarse carbides and remarkably reducing the mechanical strength of the compacts, the addition up to 10 at % is preferable.

The addition of the silicon contributes to the effects on the improvements of the thermoelectric characteristic (the percentage of the electron in the carrier increases due to the increasing number of total valence electrons in the alloyed metal) and that of fluidity of the melting material. Since an excess addition results in reducing the mechanical strength of the compacts, the addition up to 5 at % is preferable.

Accordingly, the iron alloy thermoelectric material can improve the casting performance, the thermoelectric characteristic and the fluidity of the melting material if the carbon concentration is below 0 at % up to 10 at % and the silicon concentration is below 0 at % up to 5 at %.

The addition of the sulfur as well as the silicon shows effects on improving the thermoelectric characteristic and the fluidity of the melting material. Since an excess addition results in producing a large amount of sulfides and remarkably reducing the mechanical strength of the compacts, the addition up to 0.5 at %, more preferably, 0.1 or more at % to 0.5 or less at % is preferable.

Accordingly, the iron alloy thermoelectric material can further improve the thermoelectric characteristic and the fluidity of the melting material if the sulfur concentration is below 0 at % to 0.5 or less at % in addition to the effects of additions of the carbon and silicon.

Next, the thermoelectric material was produced under the respective compositional conditions and the Seebeck coefficient and electrical resistivity were measured. Detailed results on the thermoelectric characteristic under the respective compositional conditions will be described with reference to FIGS. 1 to 4.

Figure 2:
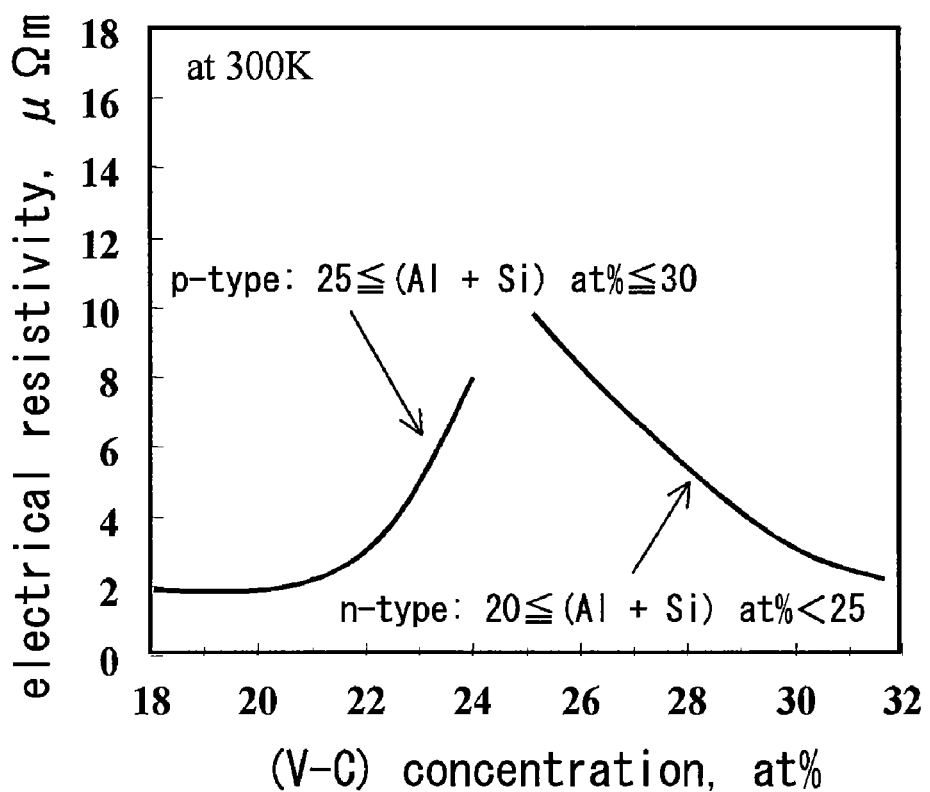
FIG. 2 is a diagram showing a relationship between the (V—C) concentration and an electrical resistivity.
Figure 3:
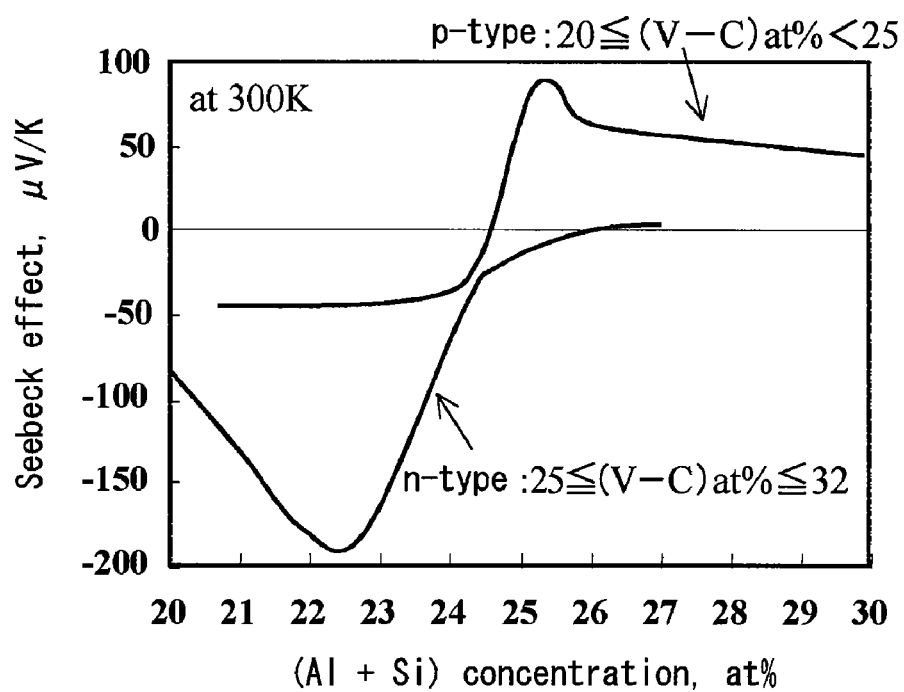
FIG. 3 is a diagram showing a relationship between a (Al+Si) concentration and the Seebeck coefficient.
Figure 4:
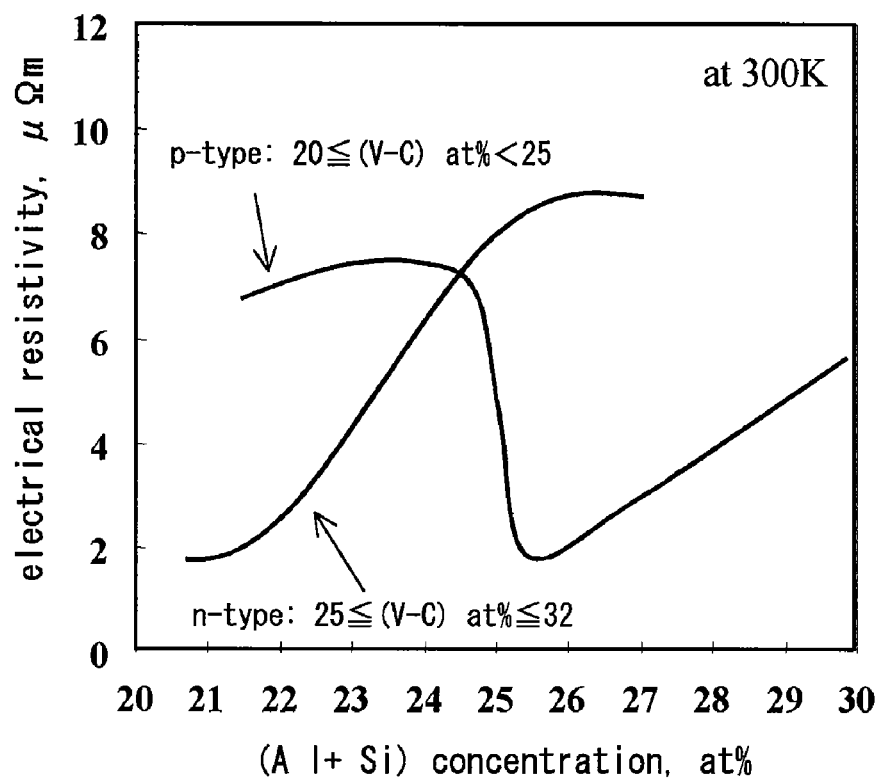
FIG. 4 is a diagram showing a relationship between the (Al+Si) concentration and the electrical resistivity.

FIG. 1 is a diagram showing a relationship between a (V—C) concentration and the Seebeck coefficient when the horizontal scale is the (V—C) concentration and the vertical scale is the Seebeck coefficient. FIG. 2 is a diagram showing a relationship between the (V—C) concentration and the electrical resistivity when the horizontal scale is the (V—C) concentration and the vertical scale is the electrical resistivity. FIG. 3 is a diagram showing a relationship between a (Al+Si) concentration and the Seebeck coefficient if the horizontal scale is the (Al+Si) concentration and the vertical scale is the Seebeck coefficient. FIG. 4 is a diagram showing a relationship between the (Al+Si) concentration and the electrical resistivity if the horizontal scale is the (Al+Si) concentration and the vertical scale is the electrical resistivity.

Referring to FIGS. 1 and 3, in the alloyed metal according to the present invention, a p-type iron alloy thermoelectric material having the high Seebeck coefficient of more than 60 $\mu V/K$ (up to 84 $\mu V/K$) can produced by adding the carbon, the silicon and the sulfur equivalent to the cast steel and by adjusting the [V concentration−C concentration] to 20~24 at % as well as the [Al concentration+Si concentration] to 25~30 at %. An n-type iron alloy thermoelectric material having the high Seebeck coefficient of more than 150 µV/K (up to 185 µV/K) can be produced by adjusting the [V concentration−C concentration] to 25~32 at % and the [Al concentration+Si concentration] to 20~24 at %.

Accordingly, so as to obtain the high Seebeck coefficient in the p-type iron alloy thermoelectric material, the [V concentration−C concentration] is 20 or more at % to less than 25 at % and the [Al concentration+Si concentration] is 25 or more at % to 30 or less at %. More preferably, [V concentration−C concentration] is 20 or more at % to less than 24 at % and [Al concentration+Si concentration] is 25 or more at % to 29 or less at %.

So as to obtain the high Seebeck coefficient in the n-type iron alloy thermoelectric material, [V concentration−C concentration] is 25 or more at % to 32 or less at % and the [Al concentration+Si concentration] is 20 or more at % to less than 25 at %. More preferably, [V concentration−C concentration] is 26 or more at % to 30 or less at % and [Al concentration+Si concentration] is 21 or more at % to 24 or less at %.

Referring to FIGS. 2 and 4, under the same condition as the above one, the electrical resistivity can be reduced by approximately 2 to 6 µΩm, thereby acquiring the superior casting performance and the high output factor (the high Seebeck coefficient and the low electrical resistivity) using simple alloy compositions. The thermal conductivity in this case is 10 to 17 W/mK and the performance index Z is a superior value up to $4.4 \times 10^{-4}$ K$^{-1}$ in combination with the p-type and the n-type.

Accordingly, so as to achieve the low electrical resistivity in the p-type iron alloy thermoelectric material according to the present invention, the [V concentration−C concentration] is 20 or more at % to less than 25 at % and the [Al concentration+Si concentration] is 25 or more at % to 30 or less at %. More preferably, [V concentration−C concentration] is 20 or more at % to 24 or less at % and [Al concentration+Si concentration] is 25 or more at % to 29 or less at %. In the n-type iron alloy thermoelectric material, [V concentration−C concentration] is 25 or more at % to 32 or less at % and [Al concentration+Si concentration] is 20 or more at % to less than 25 at %. More preferably, [V concentration−C concentration] is 26 or more at % to 30 or less at % and [Al concentration+Si concentration] is more than 21 at % to 24 or less at %.

In other words, as shown in FIGS. 1, 2, 3 and 4, in the present invention, the superior thermoelectric material can be produced without addition of various alloy elements by particularly determining the range of the constituent concentration, thereby simplifying the alloy design. Thus, the high Seebeck coefficient can be kept and the low electrical resistivity can be achieved, so that the superior thermoelectric characteristic can be obtained due to the improvement of the output factor.

Further, the thermoelectric materials of the present invention can be used with the as-cast materials by the casting. The thermoelectric materials can achieve the high performance without a post heating treatment as the known material, thereby reducing the material cost and the production cost, acquiring a good mass productivity and leading to getting larger thermoelectric conversion modules.

More specifically, the iron alloy thermoelectric materials of the present invention have superior thermoelectric characteristic without using harmful and scarce elements, thereby reducing the cost of materials. The material can also be produced by an as-cast production process, thereby simplifying the process and improving the productivity.

Incidentally, in the present invention, the vanadium carbides are separated out into the matrix by the addition of the carbon, thereby realizing the reduction of the electrical resistivity, but a similar result can be achieved by the preliminarily addition of the vanadium carbides when the materials are prepared.

The invention claimed is:

1. An iron alloy thermoelectric material, comprising Fe, V, Al, C, and Si dispersed into a matrix,
    wherein a difference between a V concentration and a C concentration ([V concentration−C concentration]) is 20 or more at % to 32 or less at %, and
    wherein a sum of an Al concentration and a Si concentration ([Al concentration+Si concentration]) is 20 or more at % to 30 or less at %.

2. The iron alloy thermoelectric material as set forth in claim 1, wherein the alloy is a p-type iron alloy, wherein the [V concentration−C concentration] is 20 or more at % to less than 25 at % and wherein the [Al concentration+Si concentration] is 25 or more at % to 30 or less at %.

3. The iron alloy thermoelectric material as set forth in claim 2, wherein the C concentration is above 0 at % to 10 or less at % and wherein the Si concentration is above 0 at % to 5 or less at %.

4. The iron alloy thermoelectric material as set forth in claim 2, further comprising S, wherein the S concentration is above 0 at % to 0.5 or less at %.

5. The iron alloy thermoelectric material as set forth in claim 1, wherein the alloy is an n-type iron alloy, wherein the [V concentration−C concentration] is 25 or more at % to 32 or less at % and wherein the [Al concentration+Si concentration] is 20 or more at % to less than 25 at %.

6. The iron alloy thermoelectric material as set forth in claim 5, wherein the C concentration is above 0 at % to 10 or less at % and wherein the Si concentration is above 0 at % to 5 or less at %.

7. The iron alloy thermoelectric material as set forth in claim 5, further comprising S, wherein the S concentration is above 0 at % to 0.5 or less at %.

8. The iron alloy thermoelectric material as set forth in claim 1, wherein the C concentration is above 0 at % to 10 or less at % and wherein the Si concentration is above 0 at % to 5 or less at %.

9. The iron alloy thermoelectric material as set forth in claim 1, further comprising S, wherein the S concentration is above 0 at % to 0.5 or less at %.

* * * * *